United States Patent [19]
Rio et al.

[11] Patent Number: 5,307,236
[45] Date of Patent: Apr. 26, 1994

[54] HEATSINK FOR CONTACT WITH MULTIPLE ELECTRONIC COMPONENTS MOUNTED ON A CIRCUIT BOARD

[75] Inventors: Pascal Rio, Bois Colombes; Patrick Magnenet, Thorigny-sur-Marne, both of France

[73] Assignee: Alcatel Telspace, Nanterre Cedex, France

[21] Appl. No.: 917,194

[22] Filed: Jul. 22, 1992

[30] Foreign Application Priority Data

Jul. 23, 1991 [FR] France .................................. 91 09281

[51] Int. Cl.⁵ ............................................. H05K 7/20
[52] U.S. Cl. ..................... 361/720; 165/80.3; 174/16.3; 257/718; 361/818
[58] Field of Search ............... 361/382, 386–389, 361/400, 424; 174/16.3, 35 R; 165/80.3, 185; 257/706, 707, 717, 718, 719

[56] References Cited

U.S. PATENT DOCUMENTS

| | | | |
|---|---|---|---|
| 3,996,447 | 12/1976 | Bouffard | 219/541 |
| 3,996,604 | 12/1976 | Kimura | 174/16.3 |
| 4,259,685 | 3/1981 | Romano | 357/81 |
| 4,342,068 | 7/1982 | Kling | 257/718 |
| 4,648,008 | 3/1987 | Neyroud | 257/719 |
| 4,674,005 | 6/1987 | Lacz | 174/16.3 |
| 4,845,590 | 7/1989 | Mikolajczak | 361/386 |
| 5,019,940 | 5/1991 | Clemens | 174/16.3 |
| 5,031,028 | 7/1991 | Galich | 353/81 |

FOREIGN PATENT DOCUMENTS

| | | |
|---|---|---|
| 0048938 | 4/1982 | European Pat. Off. . |
| 3203609 | 8/1983 | Fed. Rep. of Germany . |
| 2163598 | 2/1986 | United Kingdom . |

*Primary Examiner*—Gerald P. Tolin
*Attorney, Agent, or Firm*—Sughrue, Mion, Zinn, Macpeak & Seas

[57] ABSTRACT

A heatsink to remove heat dissipated by electronic components mounted on a circuit board comprises a thermally conductive material plate disposed over the components and attached by fixing mean near each component. The plate comprises spherical deformations facing the components and each deformation is in thermal contact with the heat source of a respective component.

10 Claims, 1 Drawing Sheet

HEATSINK FOR CONTACT WITH MULTIPLE ELECTRONIC COMPONENTS MOUNTED ON A CIRCUIT BOARD

BACKGROUND OF THE INVENTION

1. Field of the Invention

The invention concerns heatsinks which remove the heat dissipated by electronic components.

2. Description of the Prior Art

Electronic components such as transistors, thyristors, triacs, diode bridges and other components dissipating a significant quantity of heat are cooled by placing them on heatsinks which are not mounted on the electronic circuit board carrying the other components of a circuit. The components are then connected to the board by wires. The heatsinks may be large and fixed to the outside of an equipment casing, to its rear panel, for example.

If components cannot be remotely mounted, room must be provided on the electronic circuit board for mounting the heatsinks. This applies, for example, to integrated circuits dissipating a few watts, such as semi-custom application-specific integrated circuits (ASIC). It may also apply to passive components such as power resistors which cannot be remotely mounted or where this is to be avoided, for example to avoid the use of connecting wires.

The heatsinks used for this purpose usually occupy a considerable amount of space on the board.

Also known are heatsinks designed to mount directly on the integrated circuit to be cooled, in order to reduce their size. German patent application No 32.03.609 in the name of SIEMENS describes an integrated circuit heatsink of this kind. It comprises a plate bent to a U-shape whose central part is applied to the upper surface of integrated circuit, the lateral parts of the U-shape plate comprising extensions parallel to the lateral parts ending in fixing lugs. The fixing lugs are soldered with leads of the integrated circuit to the printed circuit board on which the integrated circuit is mounted. With this kind of heatsink the amount of room used up on the board is reduced because the heatsink is mounted on the component to be cooled.

The main drawback of this heatsink is that the surface in contact with the integrated circuit is flat so that there is the risk of poor cooling if the integrated circuit is not correctly positioned on the printed circuit board, in other words if its upper surface is not parallel to the board. It is therefore necessary to check that the integrated circuit is positioned correctly, which is costly, difficult and may even be impossible if the components are wave soldered.

This type of heatsink is also suitable only for integrated circuits dissipating a small amount of heat, because of the limited surface area of the heatsink. It is not possible to increase this surface area to dissipate more energy because of the resulting overall height. Also, small integrated circuits, for example eight-pin integrated circuits, are cooled less effectively because the dissipation area is reduced.

Each heatsink of this type is specifically designed for a particular size of integrated circuit and it is therefore necessary to stock a large number of different heatsinks.

An object of the present invention is to remedy these drawbacks.

To be more precise, one object of the invention is to provide a heatsink for electronic components mounted on a circuit board which has optimal thermal contact with the components to be cooled, irrespective of their position on the circuit board, and compact overall dimensions.

Another object of the invention is to provide a heatsink of this kind which is of low cost and optimally cools any type of component irrespective of its size.

SUMMARY OF THE INVENTION

The present invention consists in a heatsink adapted to remove heat dissipated by electronic components mounted on a circuit board comprising a thermally conductive material plate disposed over at least one said component and attached by fixing means near each of said components, said plate comprising part-spherical deformations facing said components each in thermal contact with the heat source of a respective component.

In this way optimal thermal contact is achieved between the heatsink and the components, even if the latter are not correctly positioned on the printed circuit board.

The deformations are advantageously formed by stamping said plate.

In an advantageous embodiment each deformation has a large radius and cooperates with thermally conductive grease to achieve a large area of heat exchange between the deformation and the respective component.

The depths of said deformations are preferably related to the height of the respective component.

In an advantageous embodiment each deformation has heat exchange contact surfaces with the respective component matched to the surface area of the heat source of said component.

The fixing means preferably comprise a spring member adapted to provide optimum thermal contact between said deformations and said components.

A layer of thermally conductive material is advantageously disposed between said components and said deformations to distribute substantially uniformly the pressure exerted by said deformations on said components.

The plate may be connected electrically to the ground of the circuit on said circuit board to constitute an electromagnetic screen for said board.

Other features and advantages of the invention will emerge from the following description of a preferred embodiment of the invention given by way of non-limiting illustrative example only and with reference to the appended drawings.

DETAILED DESCRIPTION OF THE INVENTION

Figure 1:
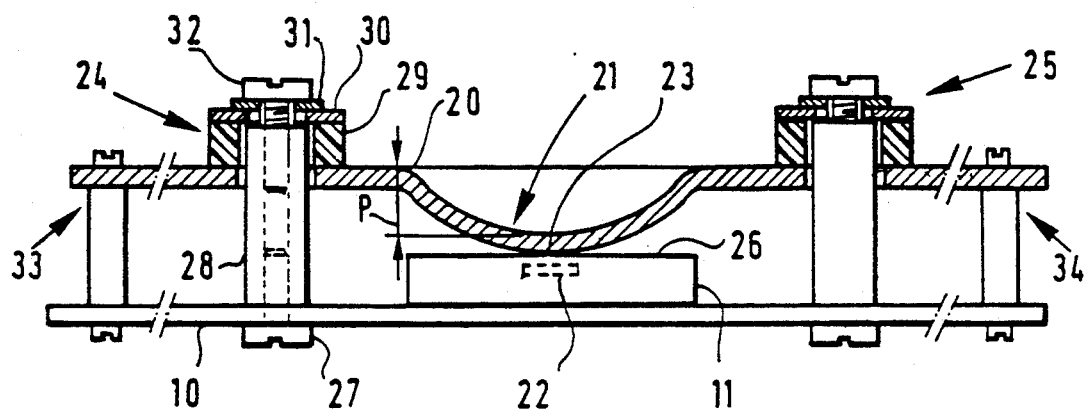
FIG. 1 is a schematic side view in partial cross-section of a preferred embodiment of the invention.

Referring to FIG. 1, a printed circuit board 10 carries a component 11 whose temperature is to be limited. A plate 20 of thermally conductive material is fixed above the component 11 which is a semi-custom ASIC, for example. The plate 20 incorporates a spherical deformation 21 centered on the chip of the integrated circuit 11.

The deformation 21 is obtained by stamping the plate 20, for example. In this way thermal continuity is achieved between the deformation 21 and the plate 20, and hence effective cooling.

Two fixing means 24, 25 provide physical contact between the upper surface 26 of the component 11 and the lower surface 23 of the deformation 21. These fixing means 24, 25 are advantageously disposed symmetrically to the point of contact with the component 11 to be cooled and as close as possible to it in order to achieve optimal contact between the deformation 21 and the component 11.

Each fixing means 24, 25 comprises a screw 27, a spacer 28, a spring washer 29, a metal washer 30 and another screw 32.

Note that the means 24 and 25 merely apply the deformation 21 to the circuit 11, the plate 20 being fixed to the board 10 by screw and spacer fixing means 33, 34 whose function is to balance the plate 20 if the fixing means 24, 25 respective to each of the components to be cooled are insufficient to retain the plate 20 on their own.

The plate may comprise a plurality of spherical deformations 21 formed at portions corresponding to the locations of components to be cooled disposed on a circuit board 10 covered by the plate 20. The plate 20 is thin (about 1.5 mm thick) its resulting elasticity is exploited to apply the spherical deformations of the plate to the respective components to be cooled by means of the fixing systems 24, 25.

Each spacer 28 is internally screwthreaded at both ends and receives the shanks of screws 27 and 32. Each spring washer is held against the plate 20 by the metal washer 30 and the screw 32. The head of the screw 32 applies pressure to the washer 30 whose diameter is substantially equal to that of the spring washer 29, through an additional washer 31 which is provided if the head of the screw 32 is not sufficiently wide to bear effectively on the spring washer 29.

By providing a fixing system of this kind on each side of the component 11 to be cooled it is possible to optimize the pressure exerted by the deformation 21 on the component 11. Pressure appropriate to the component achieves an adequate thermal coupling between the component to be cooled and the plate 20 constituting the heatsink but avoids applying excessive pressure which could damage the component. The spring washers make it possible to adjust the pressure.

If the components to be cooled are close together on the circuit board 10, three fixing systems with spring washers may be sufficient to achieve thermal contact between the components and the plate. One spring washer fixing system is then common to two components to be cooled and is disposed between them.

The height of the spacers 28 may be different according to the size of the component(s) to be cooled.

The depth P of each deformation may be determined according to the size of the component to be cooled. A heatsink of this kind is then in the form of a plate comprising as many deformations as there are components to be cooled, each deformation having a depth appropriate to the size of the component to which it is to be applied. The lower surface 23 of the deformations is advantageously centered on the heat sources of the components. In the case of integrated circuits, and especially ASICs, this heat source is usually at the center of the integrated circuit.

The deformation 21 preferably has a large radius. This makes it possible to center the point of contact 23 on the chip 22. In practise each deformation is flattened against the component to obtain an area of heat exchange rather than a point contact. It is possible to obtain a larger heat exchange area using conductive grease 53, FIG. 1 between the deformation 21 and the component 11. A plane surface in the area of contact would result in an off-center contact if there were any defect of parallelism between the surface 26 of the component and the surface 23 of the heatsink. Such defects can result from incorrect insertion of the component 11 into the holes in the board 10.

It is also possible to insert a flexible thermally conductive material 56 between the deformation 21 and the component 11 to distribute substantially uniformly the pressure exerted by the deformation 21 on the surface 26 of the component 11 and to increase the area of heat exchange. This material can be a polymer charged with conductive material, for example.

The deformations in the plate 20 are obtained by stamping, for example, using tools having a large radius at the point of contact with the component to be cooled, for example a radius in the order of 60 mm. Thermal contact can be improved by using silicone grease 53 between the component and the contact surface of the deformation. A surface area of thermal contact of approximately one square centimeter can be achieved with a film of conductive grease 53 approximately 0.1 mm thick.

Figure 2:
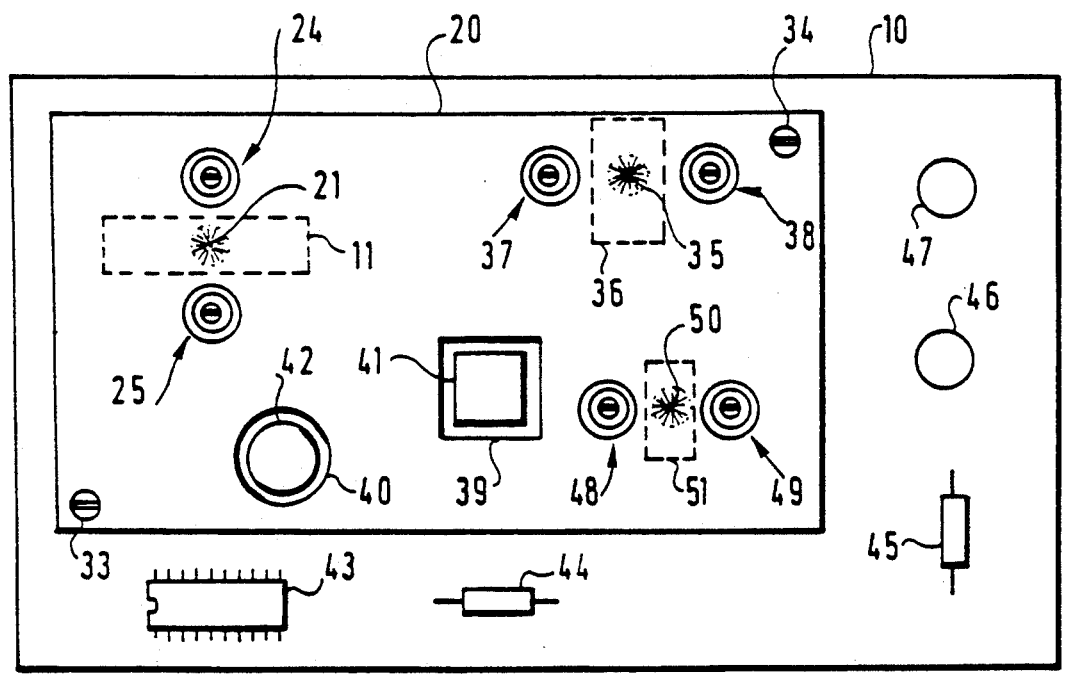
FIG. 2 is a diagrammatic top view of an electronic circuit board fitted with a heatsink in accordance with the invention.

FIG. 2 is a diagrammatic top view of an electronic circuit board 10 fitted with a heatsink 20 in accordance with the invention. The heatsink 20 covers part of the board 10 carrying three components 11, 26, 51 to be cooled. The area of the board 10 which is not covered by the plate 20 carries components 43 through 47. The plate 20 may be fixed by means of systems 33 and 34 from FIG. 1. The plate 20 comprises three deformations 21, 35 and 50 above the respective components 11, 36 and 51. Optimal contact of the deformations 21, 35 and 50 with the components 11, 36 and 51 is achieved with the aid of adjustment means 24, 25, 37, 38, 48 and 49 each of which advantageously comprises a spring washer.

The plate 20 incorporates two apertures 39 and 40 through which pass components 41, 42 which are higher than the spacers in the fixing means 33, 34 of the plate 20.

FIG. 1 shows that it is possible to place other components near the component to be cooled. In FIG. 2 the components 43 and 47 do not need to be cooled and the plate 20 does not need to cover them.

The invention makes it possible to cool effectively components dissipating considerable heat through direct contact between the component and the plate. What is more, a single plate may be used for all the components to be cooled, unlike the prior art systems in which each component is fitted with a heatsink. Dissipation of heat is thereby improved because the surface area of the heatsink is greater.

Centered thermal contact on the heat source of a component also circumvents potential problems with incorrectly positioned components. Optimum thermal contact is guaranteed even if the component is not positioned correctly, because if the upper surface of the component is not parallel to the printed circuit board the deformation will still be in the immediate vicinity of the heat source.

It is easy to adjust the contact force between each component and each deformation independently of the number of components to be cooled by virtue of the elasticity imparted by the spring washers. Finally, the system uses only standard mechanical components, apart from the heatsink itself comprising the plate incorporating one or more deformations.

The plate 20 preferably has a large surface area and it can cover all of the printed circuit board 10 to achieve good dissipation of heat.

It is advantageous to connect the heatsink plate 20 electrically by a conductor 55 to the ground 54 of the device on the electronic circuit board. The heatsink then contributes to electromagnetic screening of the board and may have edge parts bent at right angles towards the circuit board which do not impede the circulation of air but produce a partially closed cover for the components on the board.

Another advantage of the invention is that all of the surface of the electronic circuit board can be covered to achieve a very large dissipation surface.

We claim:

1. A heatsink which removes heat dissipated by at least one electronic component mounted on a circuit board, said heat-sink comprising a thermally conductive material plate disposed in parallel to said circuit board over said at least one component and non-movably attached to said circuit board by plural spacers near said at least one component, said plate comprising at least one spherical deformation facing said at least one component and in thermal contact with a heat source of said at least one component.

2. Heatsink according to claim 1 wherein said at least one deformation is a stamped deformation.

3. Heatsink according to claim 1 wherein said at least one deformation has a large radius.

4. Heatsink according to claim 1 wherein said at least one deformation has a thermally conductive grease applied thereto between the at least one deformation and said at least one component to achieve a large area of heat exchange between said at least one deformation and said at least one component.

5. Heatsink according to claim 1 wherein the depth of said at least one deformation is sized to the height of the at least one component to effect surface contact therebetween.

6. Heatsink according to claim 1 wherein said spacers carry resilient means to forcibly apply said at least one deformation to said at least one component.

7. Heatsink according to claim 1 wherein said at least one deformation comprises a plurality of spaced deformations having heat exchange contact surfaces and said at least one component comprises a like number of components and said plurality of deformations are matched to surface areas of heat sources of said components.

8. Heatsink according to claim 1 wherein said spacers carry a spring member thereby providing optimum thermal contact between said at least one deformation and said at least one component.

9. Heatsink according to claim 1 wherein a layer of thermally conductive material is disposed between said components and said deformations to distribute substantially uniformly the pressure exerted by said deformations on said components.

10. Heatsink according to claim 1 wherein said plate is connected electrically by a conductor to a ground of a circuit on said circuit board to constitute an electromagnetic screen for said circuit board.

* * * * *